FREQUENCY MODULATED OSCILLATOR WITH CARRIER FEEDBACK CONTROL

Filed Nov. 4, 1963 2 Sheets-Sheet 1

INVENTOR
Robin Rex Willett
BY
Baldwin & Wight
ATTORNEYS

July 19, 1966 R. R. WILLETT 3,262,073

FREQUENCY MODULATED OSCILLATOR WITH CARRIER FEEDBACK CONTROL

Filed Nov. 4, 1963 2 Sheets-Sheet 2

INVENTOR

Robin Rex Willett

BY Baldwin & Wight

ATTORNEYS

United States Patent Office 3,262,073

Patented July 19, 1966

3,262,073

FREQUENCY MODULATED OSCILLATOR WITH CARRIER FEEDBACK CONTROL

Robin Rex Willett, Chelmsford, Essex, England, assignor to The Marconi Company Limited, London, England, a British company Filed Nov. 4, 1963, Ser. No. 321,085
Claims priority, application Great Britain, Sept. 11, 1963, 35,849/63
4 Claims. (Cl. 332—18)

This invention relates to frequency modulated oscillator circuit arrangements and has for its object to provide frequency modulated oscillator circuit arrangements which, while being of better linearity than known comparable arrangements, shall nevertheless be relatively simple and inexpensive and readily designable and reproduceable. Although not limited to its application thereto the invention is advantageously applicable to and was initially intended for intermediate frequency modulators in multiplexed multi-channel radio relay equipments in which, in order to prevent undesired "cross-talk" effects, a very high degree of linearity is required.

According to this invention in its broadest aspect a frequency modulated oscillator circuit arrangement comprising a carrier frequency oscillator having a feed-back loop for the maintenance of carrier oscillations and means for applying modulating potentials to vary the frequency of oscillation in dependence upon the amplitude of said potentials, includes, in said feed-back loop, a frequency-dependent phase varying circuit adapted to introduce in said feedback loop a second order frequency-dependent phase variation of such magnitude as to at least approximately cancel third order non-linearity produced in the oscillator itself.

Preferably the oscillator includes a plurality of valves having their grids grounded with respect to the generated oscillation frequency and the modulation signal potentials applied to their grids and a third valve connected to act as a back coupling and amplitude limiting valve. The frequency dependent phase varying circuit is preferably in the anode circuit of the back coupling and amplitude limiting valve.

Preferably also the frequency dependent phase varying circuit comprises resistance, inductance and capacitance in parallel, the inductance and capacitance being adjustable.

The invention is illustrated in and further explained in connection with the diagrammatic and graphical accompanying drawings in which.

Figure 1:
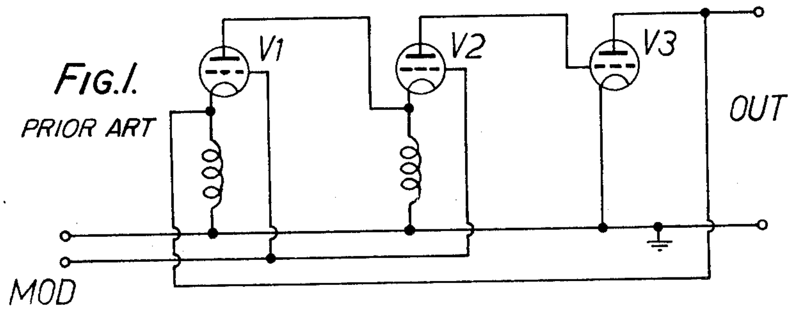
FIG. 1 is a simplified diagram of a known frequency modulated oscillator.

Referring to FIG. 1 the frequency modulated oscillator therein shown in highly simplified disgrammatic manner is widely used at the present time as a direct intermediate frequency modulator in radio relay equipments. It comprises a pair of valves or electron tubes V1, V2 which are adjusted to substantial operation identity and which have their grids grounded with respect to the carrier oscillation frequency. Modulating potentials are applied from terminals MOD. to the grids of V1 and V2. A third valve or electron tube V3 completes the oscillation generating feedback circuit. A frequency modulated output is taken off at terminals OUT.

In this arrangement the oscillation frequency $f$ is, to a first approximation, directly related to the mutual conductance $Gm$ of the valves V1 and V2 so that the relationship between $f$ and the modulation grid voltage $Vg$ is similar to the relationship between $Gm$ and $Vg$, and may be represented by the expression $$f(x)=ax+bx^2+Cx^3+ \ldots$$

If the modulator operating characteristics are correctly chosen so that the modulation is applied about an optimum value of $x$ the coefficient $b$ tends to zero and second order distortion is minimized. This is shown graphically in FIG. 2 in the upper part of which $f$, or $Gm$, is plotted as ordinates against $Vg$ and in the lower part of which $\delta f$ or $\delta Gm/\delta Vg$ is plotted against $Vg$. In this figure the chosen optimum value of $x$ is indicated conventionally by the broken line $x$ and the modulation voltage range MV is centred on the line $x$.

While the resultant modulation characteristic, (the lower part of FIG. 2) is sufficiently linear over the modulation voltage range for many purposes, it is not so for cases where very great linearity is required, e.g., if it is required to modulate an intermediate frequency oscillator with, say, an 1800 or a 2700 channel frequency division multiplex input. In such cases it is found that, even if the modulation frequency-dependent distortion terms are accurately controlled the remaining third order distortion term (the term $cx^3$ in the above expression) is excessive. For instance it can be shown that the second order variation of the first derivative of the modulation characteristic must be held to 6% or less at $f_0 \pm f$ max. (where $f_0$ is the mean intermediate frequency carrier frequency and $f$ max. is the highest modulation frequency, which might be 8.3 mc./s. in a practical 1800 channel case) if the cross-talk noise is to be kept down to the low level requirements of a modern trunk radio relay system. The known circuit of FIG. 1 will not satisfy these stringent requirements.

Figure 3:
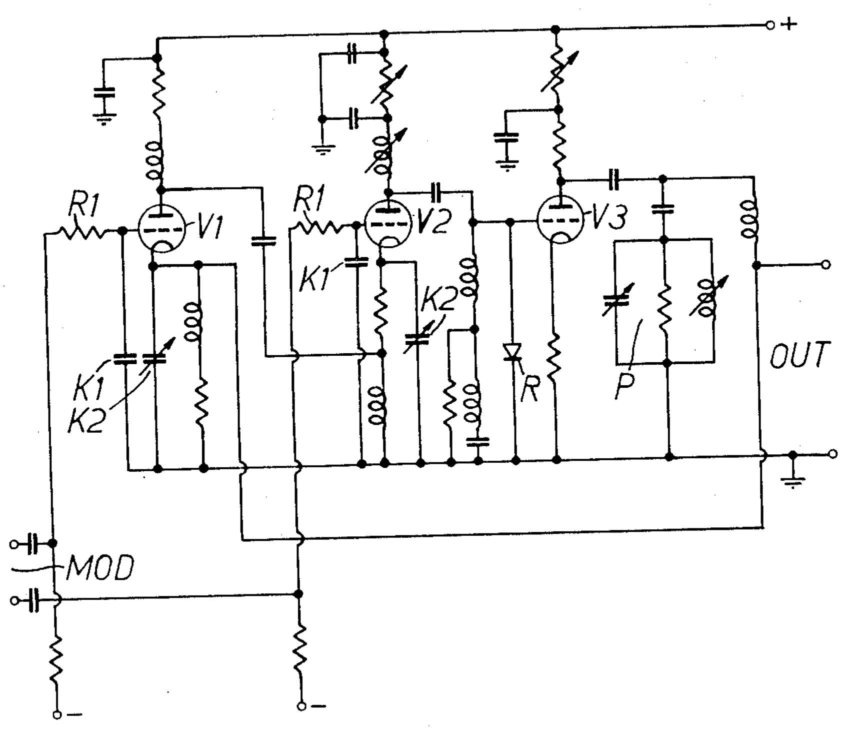
FIG. 3 shows an embodiment of this invention.

FIG. 3 shows, in more detail than FIG. 1, a preferred embodiment of this invention, with like references denoting like parts in FIGS. 1 and 3. In FIG. 3 the two valves V1 and V2 have their grids grounded with respect to the oscillating frequency (but not, of course, with respect to the modulation frequencies) through condensers K1 and modulation potentials are applied to their grids through suitable resistances R1. Their anode circuits include suitable resistance—reactance networks as known per se and their cathodes are returned to ground through suitable resistance—reactance networks again as known per se. The actual networks shown are preferred but, of course, may be substituted by others in accordance with known practice. The condensers K2 in the cathode return networks serve to adjust the mean oscillation frequency to the desired value. The third valve V3, which serves not only as a feedback coupling valve but also as an amplitude limiter by virtue of the rectifier R connected in its grid circuit, includes, in its anode circuit and in accordance with this invention, a frequency-dependent phase varying circuit P shown as comprising a resistance, an inductance and capacitance in parallel, the two latter being variable for adjustment of the Q value and resonance frequency of the circuit.

Figures 2, 4:
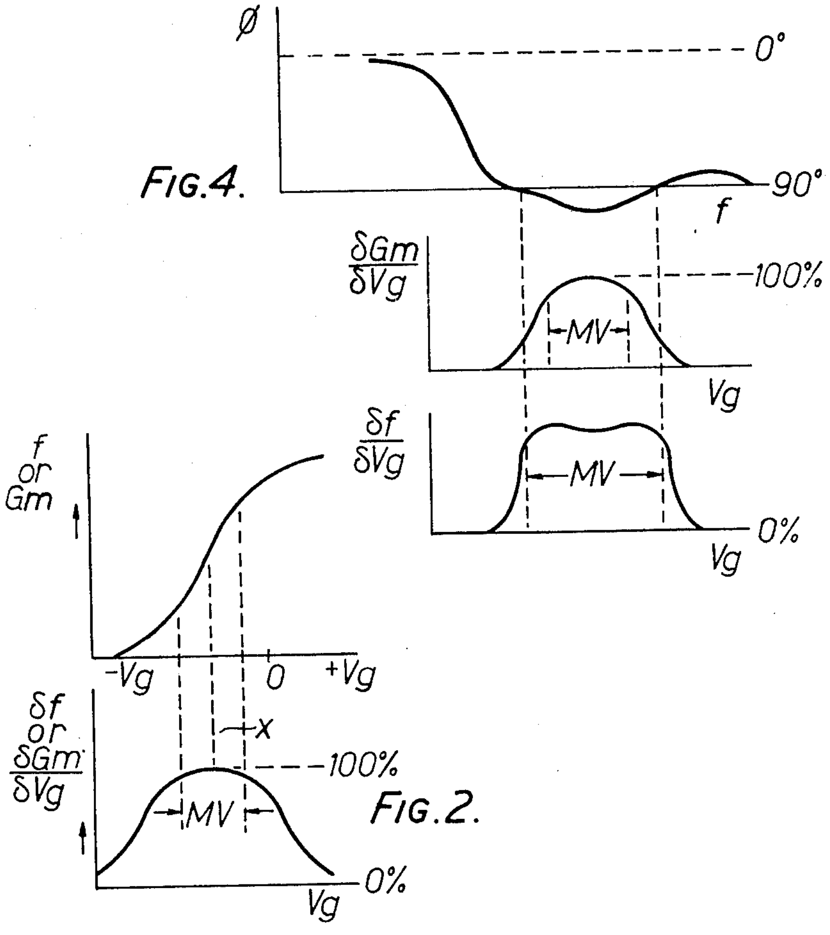
FIG. 2 is a graphical figure explanatory of the operation of the known oscillator of FIG. 1.
FIG. 4 is a series of graphs explanatory of the operation of the oscillator of FIG. 3.

With proper choice and adjustment of the components the network P may be caused to produce a second order frequency-dependent phase variation which at least approximately cancels out the third order non-linearity due to the $Gm-Vg$ characteristic already described with reference to FIG. 2. FIG. 4 shows this. The upper curve of FIG. 4 is a diagram showing the connection between the open loop phase shift $\phi$ and frequency $f$ which would be measured if the effects of phase shifts due to the modulator valve cathode circuits, phase reversal in valve V3 and phase shifts due to transit time effects in valves and circuit could be removed; the middle curve is a plot of $\delta Gm/\delta Vg$ with respect to Vg and would therefore represent the modulation characteristic were the invention not employed; and the lowest curve is the modulation characteristic $\delta f/\delta Vg$ obtained by use of the invention. The comparatively flat top of the lowest curve will be noted as also will be the wider range MV of modulation potential over which good linearity is obtainable.

In practicing the invention the oscillator itself should be designed to be as linear as is conveniently possible and the "uncorrected" modulator characteristic to be aimed at is preferably one containing mainly third order distortion (first derivative curvature) since this is correctable by a parabolic phase-frequency characteristic (of the frequency-dependent phase variation circuit) and such a characteristic is easily obtainable by a simple network.

If, however, for any reason, the oscillator employed is one producing an "uncorrected" characteristic with a predominantly second order amplitude distortion, the frequency-dependent phase variation circuit should have at least an approximately linear phase slope.

The frequency-dependent phase variation circuit will, of course, introduce a frequency-dependent amplitude (gain) term into the oscillator loop equation and this will give rise to amplitude modulation. Such amplitude modulation may, however, be removed in known manner, e.g., in subsequent amplifiers, in the designing of which due regard must, of course, be given to amplitude modulation-frequency modulation conversion effects and to group delay "freezing" effects in limiting and other non-linear circuits.

In practice valve and circuit transit times are likely to result in excess phase shift which increases substantially linearly with frequency. The main effect of this is to introduce a second order non-linearity term into the modulation characteristic (first derivative slope). This may be corrected for either by slightly off-setting the modulator operating conditions or slightly off-setting the linearizing phase characteristic of the frequency-dependent phase variation circuit.

The main advantages of the invention are: very high linearity; amenability to analysis by linear circuit theory and therefore capability of being designed with considerable accuracy of anticipation of performance; linearization is obtained by a passive network and is therefore but little dependent on the obtaining of closely controlled oscillation levels; and improved operation at high modulation frequencies is obtained since linearization is obtained instantly and not from a "signal" that has to pass at least once round the oscillating loop as is the case with certain known linearizing arrangements.

I claim:

1. A frequency modulated oscillator circuit arrangement including, a carrier frequency oscillator circuit having an output for a frequency modulated signal containing third order non-linearity, feedback coupling electronic valve means connected to said output and having an output electrode, a feedback circuit connected between said output electrode and said oscillator circuit for the maintenance of carrier oscillations, means connected to said oscillator circuit to apply modulating potentials thereto to vary the frequency of oscillation of said oscillator circuit in dependence upon the amplitude of said potentials, the improvement comprising a frequency-dependent phase varying circuit connected in said feedback circuit to introduce therein a second order frequency-dependent phase variation of such magnitude to approximately cancel third order non-linearity produced in the oscillator itself.

2. A circuit arrangement as set forth in claim 1 in which said oscillator circuit includes a plurality of electronic valves having grid electrodes grounded with respect to the generated oscillation frequency, said means connected to said grid electrodes to apply modulating potentials thereto, said grid electrodes grounded with respect to the modulating potentials of said means, and said feedback coupling electronic valve means having an anode, cathode and control electrode with said output of said oscillator circuit connected to said control electrode, said anode comprising said output electrode, and said feedback circuit connected between said anode and one of said electronic valves in said oscillator circuit.

3. A circuit arrangement as set forth in claim 1 in which said output electrode of said feedback coupling valve means is an anode, an output circuit for the frequency modulated output signal connected to said feedback circuit, and said frequency-dependent phase varying circuit connected in said feedback circuit between said anode and said output circuit.

4. A circuit arrangement as set forth in claim 1 in which the frequency dependent phase varying circuit comprises a network of resistance, inductance and capacitance connected in parallel, and said inductance and capacitance being adjustable.

References Cited by the Examiner

UNITED STATES PATENTS

| | | | |
|---|---|---|---|
| 2,445,662 | 7/1948 | Davie | 332—27 |
| 2,578,613 | 12/1951 | Sussman | 331—135 |
| 2,974,294 | 3/1961 | Ravenscroft | 332—18 |

NATHAN KAUFMAN, *Primary Examiner.*

ALFRED L. BRODY, *Examiner.*